US010910046B2

(12) United States Patent
Micakovic et al.

(10) Patent No.: US 10,910,046 B2
(45) Date of Patent: Feb. 2, 2021

(54) FLASH MEMORY WITH REFERENCE VOLTAGE GENERATION FROM A PLURALITY OF CELLS

(71) Applicants: Predrag Micakovic, Erfurt (DE);
Holger Haberla, Kranichfeld (DE);
Andrey Hudyryev, Bad Berka (DE);
Soeren Lohbrandt, Erfurt (DE)

(72) Inventors: Predrag Micakovic, Erfurt (DE);
Holger Haberla, Kranichfeld (DE);
Andrey Hudyryev, Bad Berka (DE);
Soeren Lohbrandt, Erfurt (DE)

(73) Assignee: X-FAB SEMICONDUCTOR FOUNDRIES GMBH, Erfurt (DE)

( * ) Notice: Subject to any disclaimer, the term of this patent is extended or adjusted under 35 U.S.C. 154(b) by 0 days.

(21) Appl. No.: 16/509,913

(22) Filed: Jul. 12, 2019

(65) Prior Publication Data
US 2020/0020394 A1 Jan. 16, 2020

(30) Foreign Application Priority Data
Jul. 13, 2018 (GB) .................................. 1811530.3

(51) Int. Cl.
*G11C 16/04* (2006.01)
*G11C 11/56* (2006.01)
(Continued)

(52) U.S. Cl.
CPC ...... *G11C 11/5635* (2013.01); *G11C 11/4074* (2013.01); *G11C 11/5642* (2013.01); *G11C 29/28* (2013.01); *G11C 29/34* (2013.01)

(58) Field of Classification Search
CPC ............ G11C 11/5635; G11C 11/4074; G11C 11/5642; G11C 29/28; G11C 29/34;
(Continued)

(56) References Cited

U.S. PATENT DOCUMENTS 5,142,495 A * 8/1992 Canepa ................. G11C 16/28
365/104
6,687,150 B1 2/2004 Joachim et al.
(Continued)

FOREIGN PATENT DOCUMENTS

JP 2016/225004 12/2016

OTHER PUBLICATIONS

GB, Combined Search and Examination Report under Sections 17 and 18(3); Patent Application No. GB1811530.3; 8 pages (dated Nov. 27, 2018).

*Primary Examiner* — Tha-O H Bui
(74) *Attorney, Agent, or Firm* — Thompson Hine LLP

(57) ABSTRACT

A flash memory comprising a first plurality of memory cells, each memory cell of the first plurality of memory cells selectively connected to a first input of a comparator. A second plurality of memory cells selectively connected to a second input of the comparator, wherein a first number of the second plurality of memory cells are in an erased state, wherein a second number of the second plurality of memory cells are in a written state, wherein each memory cell of the first plurality of memory cells and each memory cell of the second plurality of memory cells has a first cell capacitance, and wherein the sum of the first number and the second number is at least three.

13 Claims, 6 Drawing Sheets

(51) Int. Cl.
*G11C 11/4074* (2006.01)
*G11C 29/28* (2006.01)
*G11C 29/34* (2006.01)

(58) Field of Classification Search
CPC .... G11C 2029/1204; G11C 2029/0403; G11C 29/22; G11C 29/021; G11C 29/028; G11C 16/14; G11C 16/349; G11C 7/14; G11C 2211/5634; G11C 16/3459; G11C 16/28; G11C 7/062; G11C 16/26; G11C 16/34; G11C 2013/0054
USPC .................................................... 365/185.29
See application file for complete search history.

(56) References Cited

U.S. PATENT DOCUMENTS

| | | |
|---|---|---|
| 7,092,295 B2 * | 8/2006 | Iwase ................... G11C 29/50 365/185.19 |
| 7,116,597 B1 | 10/2006 | Goldman et al. |
| 2011/0194330 A1 | 8/2011 | Liu et al. |

* cited by examiner

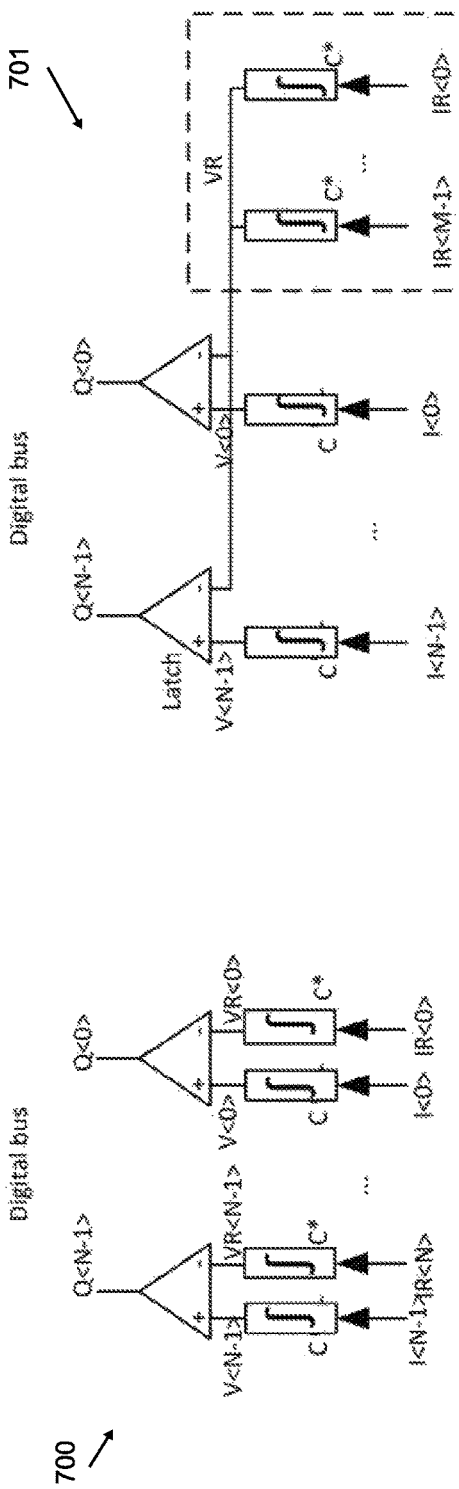
Fig. 7(a)
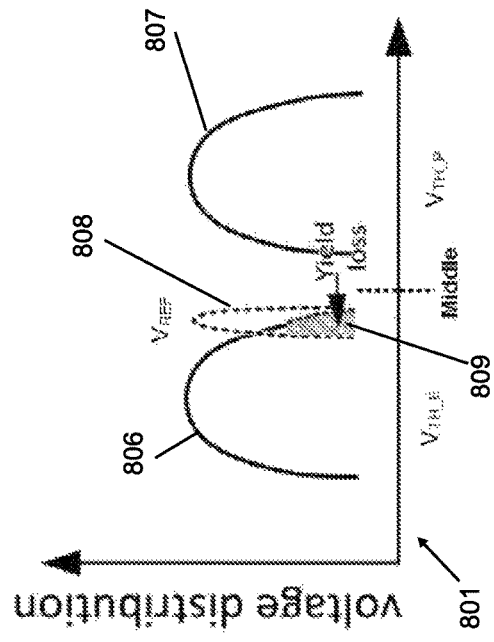
Fig. 7(b)
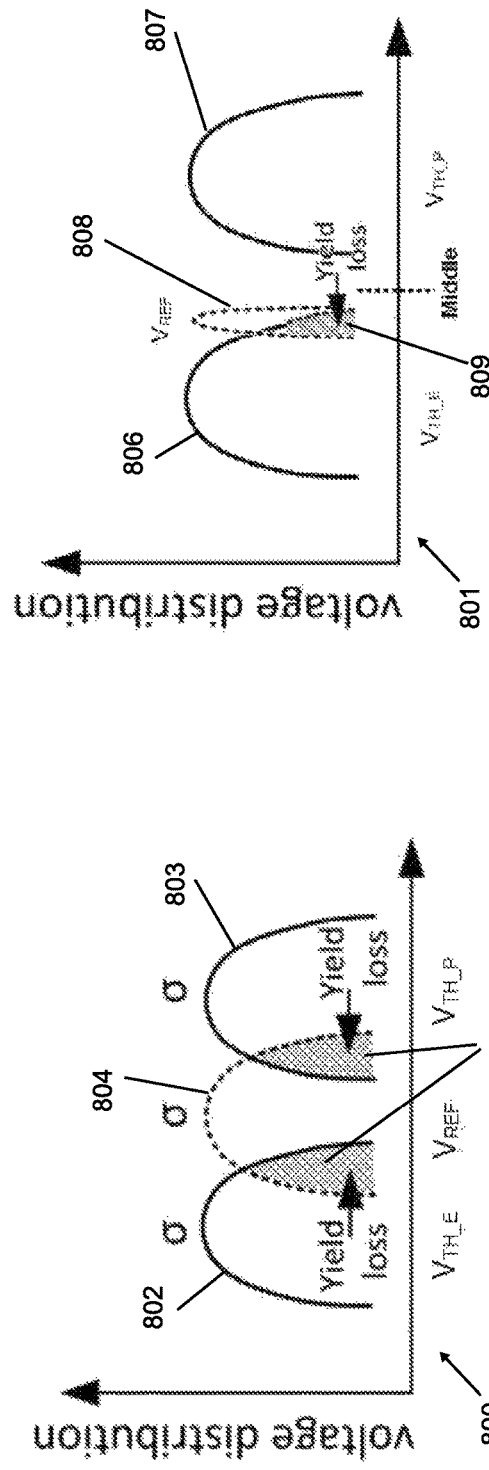
Fig. 8(a)
Fig. 8(b)

FLASH MEMORY WITH REFERENCE VOLTAGE GENERATION FROM A PLURALITY OF CELLS

This application claims priority to United Kingdom Patent Application No. 1811530.3 filed on Jul. 13, 2018, the entire contents of which are hereby incorporated by reference.

TECHNICAL FIELD

The present invention relates to the field of memory design. In particular, the invention relates to non-volatile, flash memory and the conversion of analogue memory data to digital memory data.

BACKGROUND

Demand for low cost yet high performance embedded flash memory is constantly increasing. Such flash memories are expected to operate over an ever increasing voltage and temperature range and achieve ever greater data retention while also reducing susceptibility to disturbance effects. This is expected to be achieved at an ever decreasing cost.

One factor that affects the cost of flash memories is the time required to test and calibrate the memory. Reducing this time typically has the effect of reducing the production cost of the memory. Test and calibration time is, in part, dependent on optimizing the architecture of the read path of the memory.

With reference to FIG. 1, typically a flash memory 101 is built in an array structure with a number of rows and columns. Rows are referred to as wordlines 102 while columns are referred to as bitlines 103. Each memory cell 104 of the array has an address or coordinate (X, Y) denoting its position in the array. Every memory cell can be selected by applying a combination of the addresses or coordinates to X and Y decoders 105, 106. The array is divided into N sticks 107a, 107b, 107n, each stick comprising a predetermined number of bitlines connected to a respective multiplexer 108a, 108b, 108n which is in turn connected to an input of a respective comparator 109a, 109b, 109n. The purpose of the stick/multiplexer arrangement is to reduce the number of comparators required in the array, thus reducing array architecture complexity. The comparators 109a, 109b, 109n are responsible for the read operation of the memory cells. The output of each comparator is one digital bit (i.e. a 1 or a 0). Together, the N sticks (i.e. the predetermined number of bitlines connected to multiplexers and comparators) are said to be a digital bus. The comparators compare an input signal with a reference signal and output a signal indicating which is larger. If the input signal is larger than the reference signal, the output corresponds to a "1" (i.e. written state). If the input signal is smaller than the reference signal, the output corresponds to a "0".

The main operation modes of flash memory are write, erase and read. Write and erase modes are used to store data, while the read operation is used to convert the analogue information of the state of the memory cells into digital values.

A basic feature of non-volatile memory transistor cells is the ability to shift their threshold voltage by applying a high voltage to their terminals. The threshold voltage is the minimum gate-source voltage that is needed to create a conducting path between the source and drain terminals of a transistor.

During the erase operation the threshold voltage is shifted to an erased state ($V_{TH\_E}$), and during the write operation the threshold voltage is shifted to a programmed state ($V_{TH\_P}$), also known as a written state. In both cases during the erase and write operations the high voltage is applied to a group of selected memory cells. The smallest number of memory cells that can be erased simultaneously is all of the memory cells within one wordline. Another erase mode is "flash (or mass) erase", where all memory cells of the entire array are erased at the same time. Once a memory cell has been erased, write mode can be performed. Each memory cell of a selected wordline can be changed to a programmed state or left in a previous state.

With reference to FIG. 2, during the read operation, a given memory cell can be selected/addressed based on its (X, Y) coordinate by enabling the gate of the selected transistor of one wordline and enabling the current flow of the selected bitline to a sense amplifier 201. A separate bitline called the reference bitline is used to generate a reference threshold voltage value ($V_{REF}$) which is between the erase ($V_{TH\_E}$), and programmed ($V_{TH\_P}$) voltage values. The purpose of the reference threshold value ($V_{REF}$) is to provide a reference value against which the erased ($V_{TH\_E}$) and ($V_{TH\_P}$) programmed values can be compared to determine what state a given cell is in.

As described above with reference to FIG. 2, in a commonly used read out approach, the sense amplifier(s) 201 is realized as a comparator 202 (e.g. latched comparator) which compares the voltage levels produced by integration of the input signal current 203 (i.e. from the memory cell being read) with the voltage level produced by integration of the reference current 204 from the reference bitline. Each of the N sticks has the same sense amplifier structure. As described above, the sticks together are said to be a digital bus.

Each memory cell will have a slightly different threshold voltage value (and thus different discreet erase ($V_{TH\_E}$) and programmed ($V_{TH\_P}$) voltage values) resulting from e.g. manufacturing inconsistencies and imperfections. One of the reasons for the inherent variability in the operational response of each cell is that the minimum transistor sizes required for correct functioning of the memory results in different cell responses to different process, voltage and temperature conditions. For example, the resistance of one cell might change more or less than the resistance of another cell under the same temperature change. Given the large number of memory cells present in any given array, it is not possible precisely to determine or calibrate the array to operate at these unique, discreet erase ($V_{TH\_E}$) and programmed ($V_{TH\_P}$) voltages for each memory cell.

Instead, the discreet erase and programmed voltages of each cell are considered to be distributed around the mean values of $V_{TH\_E}$ and $V_{TH\_P}$ in distributions in the form of a Gaussian curve, each having a standard deviation $\sigma_{TH\_E}$ and $\sigma_{TH\_P}$ (which can, but don't have to, be identical to each other). This is shown in distributions 300 and 400 in FIGS. 3 and 4. Distributions 301/401 is a Gaussian distribution around the mean of $V_{TH\_E}$, and distribution 302/402 is a Gaussian distribution around the mean of $V_{TH\_P}$.

Similarly, the cells in the reference bitline that are used to generate the reference voltage ($V_{REF}$) also suffer from an inherent variability and thus do not always produce the same reference voltage each time. As such, the reference voltage may also be distributed about a mean of $V_{REF}$ and have a standard deviation of $\sigma_{REF}$. This is shown in distribution 303 in FIG. 3. The respective standard deviations define the width of the respective distributions.

The separation between the maximum level ($V_H$) of the $V_{TH\,E}$ distribution and the minimum level ($V_L$) of the $V_{TH\,P}$ distribution is typically called the effective memory cell window ($MW_{EFF}$) 403 (see FIG. 4).

When the reference voltage value ($V_{REF}$) which is output by the reference bitline always falls between $V_H$ and $V_L$ (i.e. the maximum or minimum level of the $V_{REF}$ distribution never overlaps with $V_H$ or $V_L$), a read operation, if initiated, will be successful.

However, because of memory cell transistor reliability effects such as data retention, endurance cycling and disturb effects, the memory cells' response under different process, voltage and temperature conditions becomes less consistent over time, causing the standard deviations $\sigma_{TH\,E}$ and $\sigma_{TH\,P}$ of the $V_{TH\,E}$ and $V_{TH\,P}$ distributions to become larger and/or cause the mean of one or both of the distributions to shift in position over time. These effects cause $MW_{EFF}$ to degrade over time (i.e. the size of the separation between $V_H$ and $V_L$ into which the $V_{REF}$ distribution has to fit without overlap decreases). When it is no longer possible to avoid overlap, some read operations will fail and the memory is said to have reached its end of life (EOL). It is desirable to overcome the effects of the degradation of $MW_{EFF}$ in order to increase the lifetime of the memory.

In an ideal situation, the greatest operational robustness (i.e. consistency of response under a wide variety of process, voltage and temperature ranges) can be achieved and therefore the effect of $MW_{EFF}$ degradation reduced when each memory cell in an array has its own uniquely calibrated reference bitline, calibrated specifically so that the output $V_{REF}$ falls between $V_H$ or $V_L$. However, this would not be practical given the very large number of additional cells that would be required. Further, when the number of cells is large, it is difficult to manufacture all cells to be identical. As such, there is an inherently large variability in responses to different process, voltage and temperature ranges in a single memory device. This makes it difficult to reduce the standard deviations $\sigma_{TH\,E}$ and $\sigma_{TH\,P}$ of the $V_{TH\,E}$ and $V_{TH\,P}$ distributions. Indeed the $V_{TH\,E}$ and $V_{TH\,P}$ distributions are typically wide relative to the $MW_{EFF}$ and further increase in width at the end of life condition of the memory.

One option, described in U.S. Patent Application Publication No. 2011/194330, is to try to reduce the standard deviation $\sigma_{REF}$ of the reference voltage $V_{REF}$. In U.S. Patent Application Publication No. 2011/194330 this is achieved by determining the $V_{TH\,E}$ and $V_{TH\,P}$ of two single cells (also described as storage elements) each in a different state (i.e. one storage element in an erased state and one in a written/programmed state). The $V_{REF}$ for read-out is the numerical average of these two values.

Another technique, described in U.S. Pat. No. 6,687,150 (Joachim et al), is to use a plurality of differently sized cells (i.e. cells with a different channel length (e.g. higher channel length) or different channel width, or a combination of both such that they have a different, higher cell capacitance and switching behavior compared to other memory cells in a memory array) within one wordline to get as close as possible to an average level of $V_{REF}$ for read out. The size of the reference cells of U.S. Pat. No. 6,687,150 is chosen to produce a higher cell capacitance compared to the regular memory cells of the array so as to help distinguish between the different states (programmed or erased) of regular memory cells. Whilst FIG. 1 of U.S. Pat. No. 6,687,150 (Joachim et at) shows a memory cell using a capacitor 140, the embodiments described herein do not necessarily require such a capacitor.

SUMMARY

This invention in one case provides a flash memory and a method of operating a flash memory as set out in the accompanying claims. In one embodiment the invention is a flash memory including a first plurality of memory cells, each memory cell of the first plurality of memory cells selectively connected to a first input of a comparator, and a second plurality of memory cells selectively connected to a second input of the comparator. A first number of the second plurality of memory cells are in an erased state and a second number of the second plurality of memory cells are in a written state. Each memory cell of the first plurality of memory cells and each memory cell of the second plurality of memory cells has a first cell capacitance, and the sum of the first number and the second number is at least three.

Exemplary embodiments of the invention will now be described, by way of example only, with reference to the accompanying drawings.

BRIEF DESCRIPTION OF THE DRAWINGS

FIG. 7(a) shows a digital bus architecture.

FIG. 7(b) shows a digital bus architecture according to an embodiment of the invention.

FIG. 8(a) shows graph illustrating yield loss where a wide reference voltage distribution overlaps with the erased and programmed state voltage distributions.

FIG. 8(b) shows a graph illustrating yield loss where a narrow reference voltage is not centered between the erased and programmed state voltage distributions.

DETAILED DESCRIPTION

Figure 1:
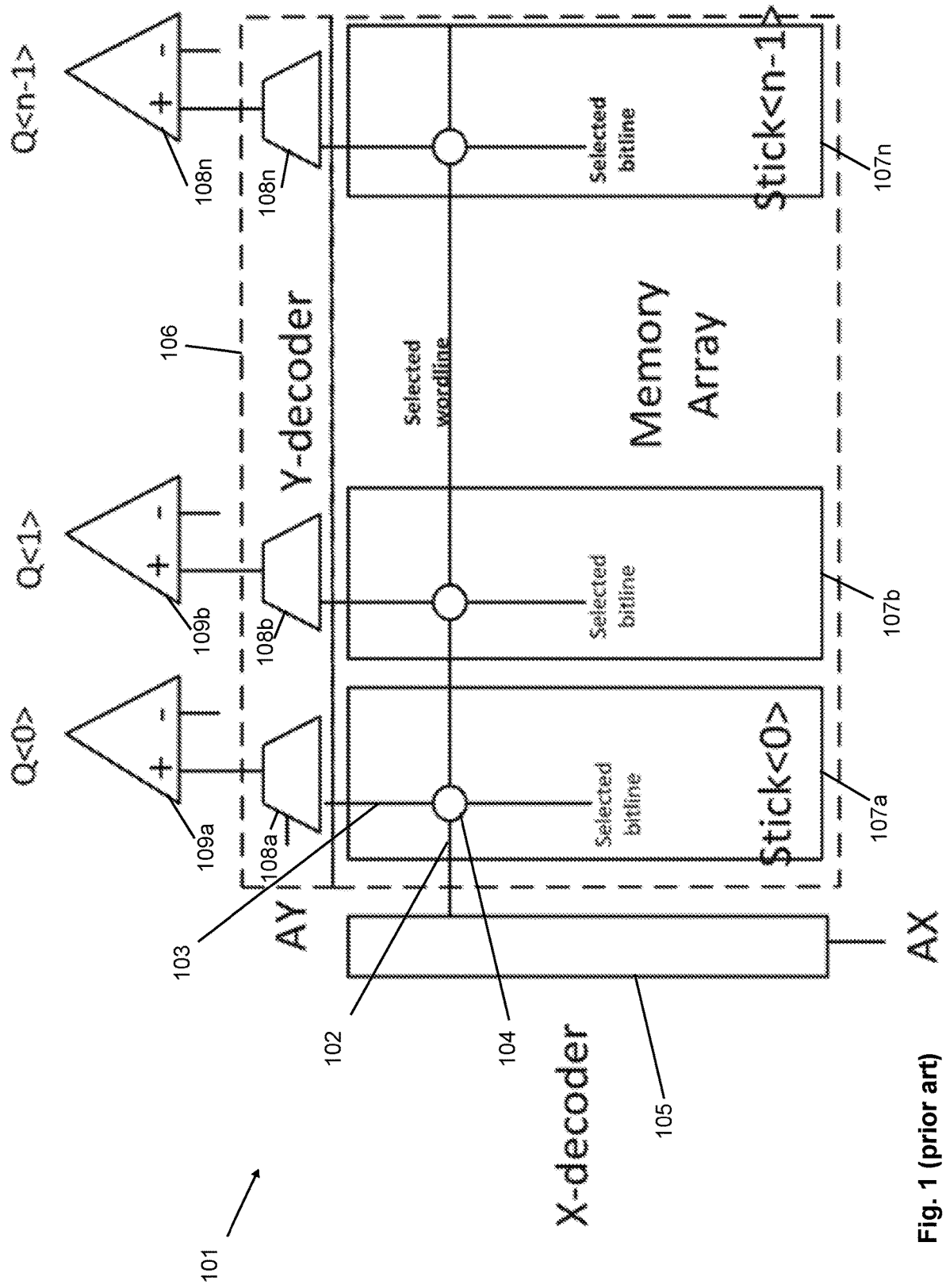
FIG. 1 shows a known flash memory array structure.

The present disclosure provides a method to improve memory robustness by reducing the effects of $MW_{EFF}$ degradation caused by transistor reliability effects under different process, voltage and temperature ranges. This may be achieved by providing a reference voltage $V_{REF}$ which is generated from a plurality of memory cells in multiple reference bitlines, each cell being in different storage states (i.e. erased or programmed), and each of the plurality of memory cells having the same size (e.g. same channel length and width, and construction and thus the same cell capacitance) as the rest of the memory cells in a memory array.

As described above, there is an inherent variability in the response that different memory cells have when operating under a range of process, voltage and temperature ranges. As the memory ages, this variability increases and this reduces the robustness of the memory as the width of $MW_{EFF}$ decreases.

The technique used in U.S. Pat. No. 6,687,150 to obtain an average $V_{REF}$ with a narrow $G_{REF}$ has been found to not produce a $V_{REF}$ positioned close to the middle between $V_H$ and $V_L$. If the center of the $V_{REF}$ distribution is positioned too far from the middle and too close to $V_H$ or $V_L$, it does not matter how narrow it is as the memory will still start to fail as soon as there is overlap between the $V_{REF}$ distribution and the $V_H$ or $V_L$ values. If $V_{REF}$ is very close to the $V_H$ or $V_L$ values when $MW_{EFF}$ starts to narrow, end of life is often reached very quickly.

One of the causes of a non-centered $V_{REF}$ distribution in U.S. Pat. No. 6,687,150 is that the reference cells used to generate $V_{REF}$ have a different size and thus cell capacitance compared to the cells of the rest of the memory. These differently sized reference cells have different response characteristics compared to the other cells of the array when operating under varying process, voltage and temperature ranges. This causes the center of the $V_{REF}$ distribution generated by the differently sized reference cells to be positioned at a distance from the middle of the $V_{TH\_E}$ and $V_{TH\_P}$ distributions (i.e. the mathematical middle between $V_H$ and $V_L$). In particular, it will be closer to either $V_H$ or $V_L$, depending on the operating conditions.

An example of a process variation effect is one that arises as a result of poly etching techniques used during manufacture. In particular, tolerated manufacturing variations caused by the poly etching technique creates variations in the effective channel length of different cells (and thus how they respond under different conditions), the shorter the length, the stronger the influence that a manufacturing variation can have on cell response. Because reference cells have a different channel length in U.S. Pat. No. 6,687,150 compared to the memory cells, the influence that the process variation has on the response of the shorter length cells is different to the influence that the variations have on the longer length cells. Similarly, other manufacturing techniques which permit tolerated manufacturing variations may suffer from similar types of process dependencies.

An example of a voltage variation effect is that the threshold voltage of a transistor depends on its channel length. Different channel lengths cause different voltage dependencies (i.e. different response characteristics under different voltages).

This disadvantage may be able to be overcome by generating a $V_{REF}$ distribution not from separate reference cells of greater cell capacitance, but instead from memory cells taken from the rest of the cells which make up the memory array and which thus have the same size (e.g. channel length, width and construction and thus cell capacitance) as the other cells in the array. This results in all of the cells having identical process, voltage and temperature dependency. This contrasts with the differently sized reference cells of U.S. Pat. No. 6,687,150. As described above, by using memory cells having the same cell size (e.g. channel length, width and construction and thus capacitance) as the other array cells to generate the $V_{REF}$ distribution, it will mean that both the reference cells and the cells being read will have a much closer dependency and operating response to varying process, voltage and temperature ranges than reference cells with a different cell size and thus capacitance. As all the cells (i.e. reference cells and the other cells in the array) are the same size, they will inherently respond in the same way to different operating conditions and the $V_{REF}$ distribution will be far closer to the actual middle of $MW_{EFF}$ i.e. the mathematical middle in between $V_H$ and $V_L$ across a much larger set of process, voltage and temperature ranges.

The above described technique may be able to be implemented by generating a $V_{REF}$ distribution using an average calculated from memory cells selected so as to be spread out evenly across the memory array, and which are in a combination of erased and programmed (i.e. written) states. The total number of cells from which the average is calculated is three or more. This contrasts with the technique used in U.S. Patent Application Publication No. 2011/194330, which generates an average $V_{REF}$ using only two single cells, positioned at single points in the array (i.e. having single point characteristics which depend on the position they have in the array), one in an erased state and one in a written/programmed state. Whilst the technique used in U.S. Patent Application Publication No. 2011/194330 may produce a narrow $V_{REF}$ distribution, it cannot compensate for the scenario where there is an unequal distribution of erased and programmed state cells around the memory array. The unequal distribution of cells in different states around a memory array results in a shift of the positions and/or widths of the $V_{TH\_E}$ and $V_{TH\_P}$ distributions. An example reason for this is that tolerated manufacturing process variations may have resulted in certain areas of the array having higher channel lengths compared to other areas, thus having different response characteristics. Thus, even if $V_{REF}$ is narrow, if the positions and widths of the $V_{TH\_E}$ and $V_{TH\_P}$ distributions have shifted due to an unequal distribution to such an extent that they overlap with $V_{REF}$, the memory may still start to fail and reach end of life sooner. Generating a $V_{REF}$ distribution using an average calculated from multiple reference bitlines made up of a plurality of memory cells taken from positions spread out evenly across the array overcomes this disadvantage.

The above described techniques may be able to be further improved by changing the ratio of erased to programmed state cells in the plurality of memory cells used to generate the $V_{REF}$ distribution. This ratio can be defined during a memory array characterization step (e.g. during array manufacture and calibration). Once the ratio is defined it can be used during all write operations. As described above, the voltages that make up the $V_{TH\_E}$ distribution (i.e. erased cells) are lower than the voltages that make up the $V_{TH\_P}$ distribution (i.e. written/programmed cells). By changing the ratio, the $V_{REF}$ distribution (which is generated as an average of the higher $V_{TH\_P}$ voltages and lower $V_{TH\_E}$) will have its center position shifted higher or lower as required. By including more erased cells, the center of the $V_{REF}$ distribution will be shifted closer to $V_L$. In contrast, by including more programmed (i.e. written state) cells, the center of the $V_{REF}$ distribution will be shifted closer to $V_H$.

The above described techniques each contribute individually and together to enable the center of the generated $V_{REF}$ distribution to be positioned much closer to the mathematical middle between $V_H$ or $V_L$ than is possible with the technique of U.S. Pat. No. 6,687,150 while simultaneously providing the means to shift the center of the $V_{REF}$ distribution if necessary, to respond to unequal distributions of erased and written cells which is not possible using the technique of U.S. Patent Application Publication No. 2011/194330.

Figure 5:
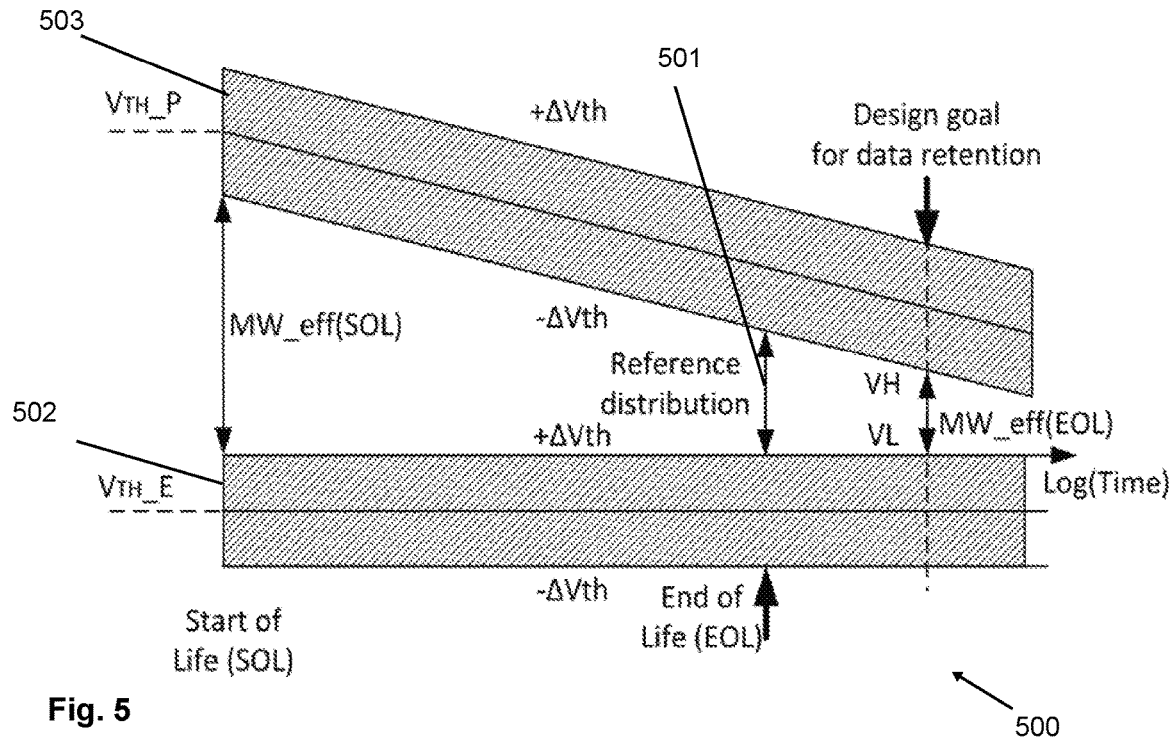
FIG. 5 shows a diagram illustrating the relationship between memory end of life and the width of a reference voltage distribution.
Figure 6:
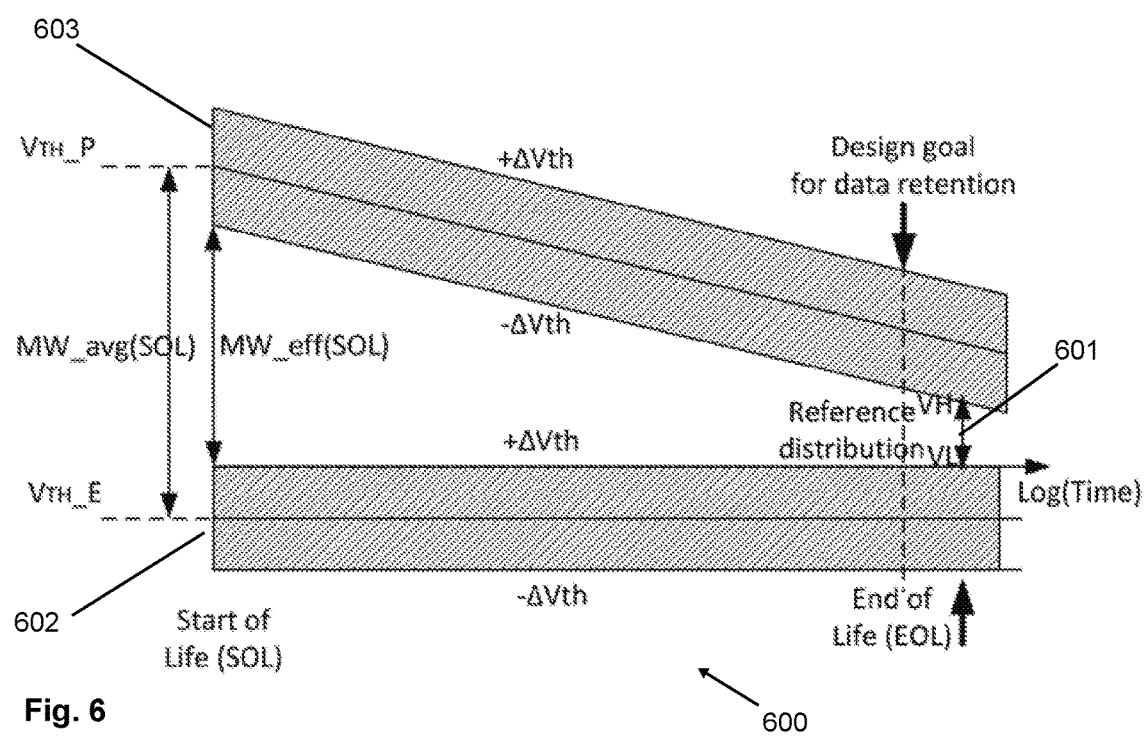
FIG. 6 shows a diagram illustrating the relationship between memory end of life and the width of a reference voltage distribution which has been narrowed.

The effect of the above described techniques is illustrated in FIGS. 5 and 6. In graph 500, the reference distribution 501 is relatively wide so overlaps much sooner with the highest voltage in the $V_{TH\_E}$ distribution 502 and the lowest voltage in the $V_{TH\_P}$ distribution 503, thus reaching end of life much sooner. Additionally, whilst not shown in FIG. 5 or 6, if the reference distribution is not centered, overlap could also occur sooner, resulting in reaching end of life sooner.

In contrast, graph 600 shows where end of life might occur with a narrower reference distribution 601 which is more closely centered than in graph 500. Even though $MW_{EFF}$ decreases in size over time, the reference distribution 601 is narrow enough and centered enough to fit in between the highest voltage in the $V_{TH\_E}$ distribution 602 and the lowest voltage in the $V_{TH\_P}$ distribution 603 for a much greater period of time. In other words the time between the start of life of the memory and end of life is increased, helping to enable the memory designer to meet a chosen design goal more easily.

Figure 2:
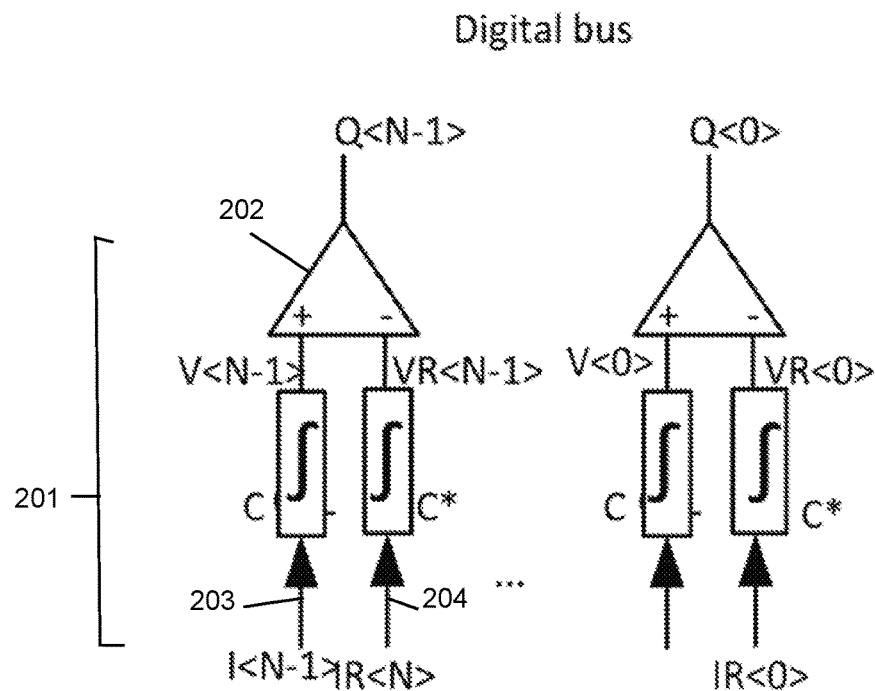
FIG. 2 shows a known digital bus architecture.

FIGS. 7(a) and (b) illustrate the difference between a known digital bus 700 and a digital bus 701 according to an embodiment of the invention. FIG. 7(a) is identical to the known digital bus 201 shown in FIG. 2. FIG. 7(b) shows a digital bus 701 having a reference block 702 configured to receive signals from at least three memory cells selected from evenly distributed positions around the array. A first number of the selected memory cells are in an erased state, and a second number of the memory cells are in a programmed state. The ratio of the first number to the second number is a factor in determining the center position of the $V_{REF}$ distribution. The ratio can be changed (e.g. during an array characterization step during manufacture and calibration) to shift the center position of the $V_{REF}$ distribution. In order to change the ratio, a write operation can be performed on the memory cells of the reference block. If the position of $V_{REF}$ is to be shifted higher, write operations may be performed such that more cells in the reference memory block are set to be in their written state. Conversely, if the position of $V_{REF}$ is to be shifted lower, write operations may be performed such that more cells in the reference memory block are set to be in their erased state. The total number of selected cells is a factor in determining the width of the $V_{REF}$ distribution, as will be described below. It is envisaged that the total number of cells in the reference memory block and the ratio of written cells to erased cells is fixed during an array characterization step during manufacture and calibration. The output from the reference member block 702 is the input into each of the comparators of the digital bus 701.

Figure 3:
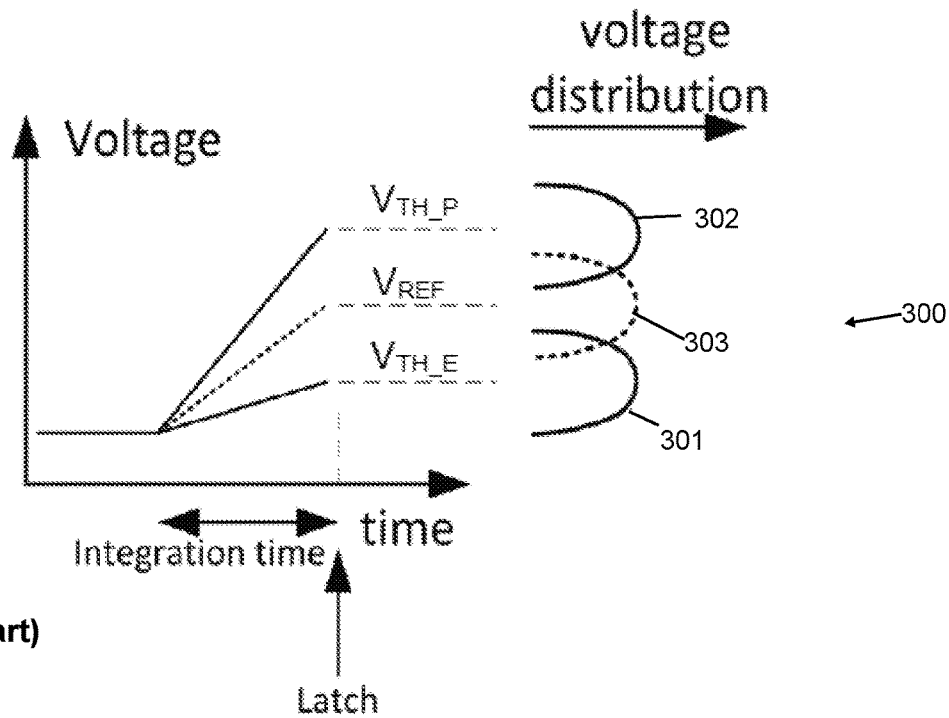
FIG. 3 shows a graph illustrating voltage distributions during a memory read operation.
Figure 4:
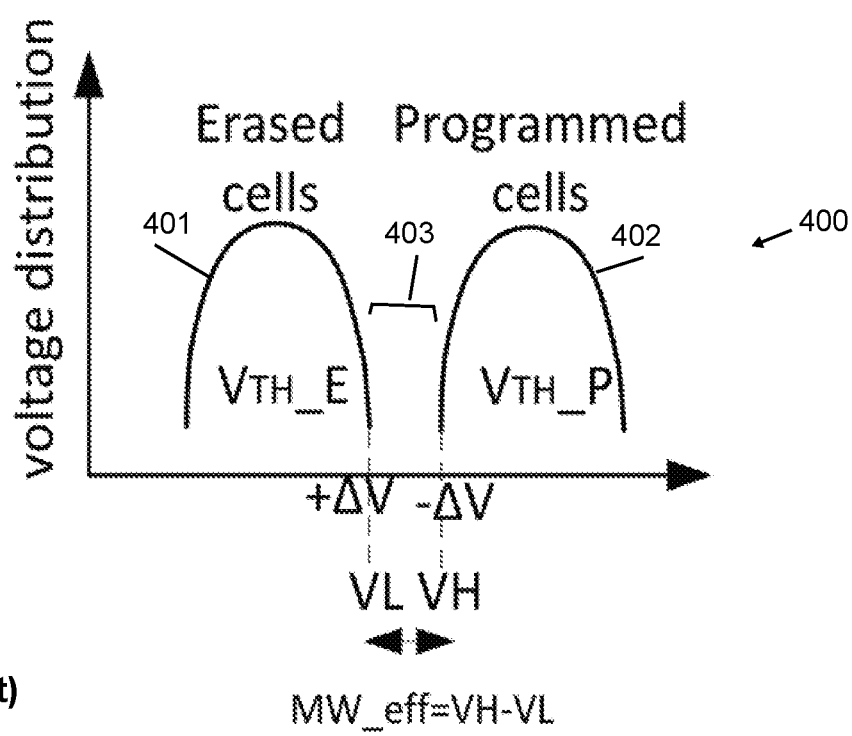
FIG. 4 shows a graph illustrating the effective memory window during a memory read operation.

FIGS. 8(a) and 8(b) show graphs 800, 801 of voltage distributions obtained using known techniques. Graph 800 in FIG. 8(a) shows $V_{TH\_E}$, $V_{TH\_P}$, and $V_{REF}$ distributions 802, 803, 804 which are similar to the distributions shown in FIG. 3 and which indicate a yield loss 805 (i.e. failed memory read operations) where the distributions overlap. Graph 801 in FIG. 8(b) shows $V_{TH\_E}$, $V_{TH\_P}$, and $V_{REF}$ distributions 806, 807, 808 where the $V_{REF}$ distribution 808 is narrowed but is not centered in the middle between $V_H$ or $V_L$. Rather, it is positioned too close to the edge of the $V_{TH\_E}$ distribution 806, resulting in overlap and yield loss 809.

Figure 9:
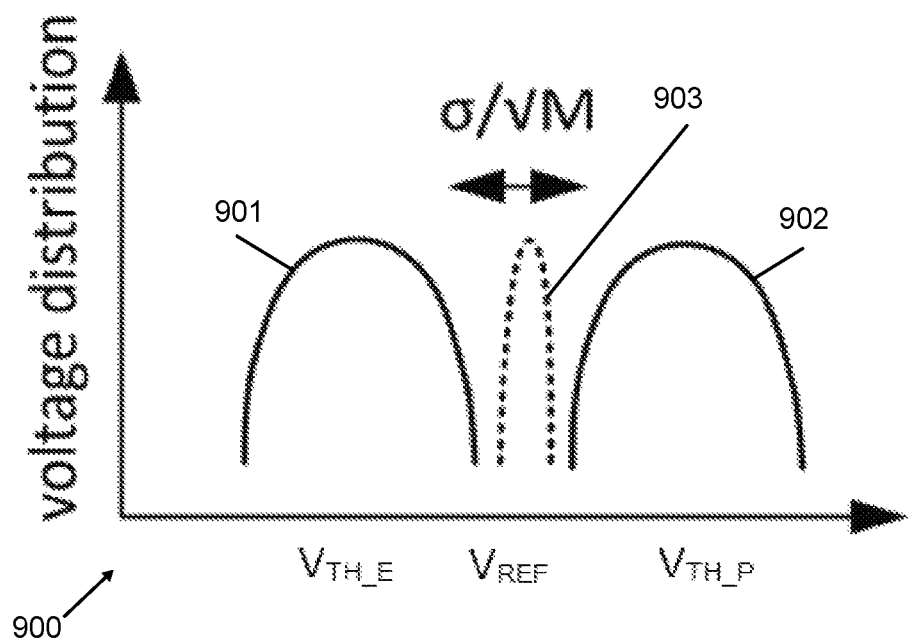
FIG. 9 shows a graph illustrating a narrowed, centered reference voltage distribution obtained using an embodiment of the invention.

In contrast, FIG. 9 shows a graph 900 of $V_{TH\_E}$, $V_{TH\_P}$, and $V_{REF}$ distributions 901, 902, 9034 obtained using the above described techniques. The $V_{REF}$ distribution 903 is narrowed and is centered the between $V_{TH\_E}$, $V_{TH\_P}$ distributions 901, 902 without overlap, thus guaranteeing successful read operations without yield loss.

A flash memory according to the above described techniques comprises a first plurality of memory cells, each memory cell of the first plurality of memory cells selectively connected to a first input of a comparator, where selectively connected may be understood to mean that each cell may be addressed using an X,Y decoder and read accordingly. A second plurality of memory cells selectively connected to a second input of the comparator. In contrast to the first plurality of memory cells, the second plurality of memory cells are all connected to all of the second inputs of each of the comparators of the memory (where multiple comparators are present). A first number of the second plurality of memory cells are in an erased state. A second number of the second plurality of memory cells are in a written state. Each memory cell of the first plurality of memory cells and each memory cell of the second plurality of memory cells has the same cell size and thus capacitance. The sum of the first number and the second number is at least three. Each of the memory cells of the first plurality of memory cells is capable of generating a first signal to be received at the first input of the comparator (i.e. the signal associated with the cell(s) being read). The second plurality of memory cells together generate a second signal to be received at the second input of the comparator (i.e. the reference voltage signal).

It is envisaged that all of the memory cells of the second plurality of memory cells in the second plurality of memory cells are in at least an erased or written state. However, it is also possible to implement the system and method where this is true of only a majority (but not all) of the memory cells of the second plurality of memory cells. This allows the above described techniques to be combined with existing techniques to produce a hybrid system.

As described above, during a read operation, a digital bit is detected by way of a comparison, at the comparator, of the reference voltage signal with an input voltage signal received from the memory cell being read. As there are multiple comparators, multiple digital bits (i.e. N digital bits) can be detected at the same time. As described above, due to inherent variability in response under different process, temperature and voltage operating conditions, both the reference signal and the N input signal voltages will be distributed about a respective mean and have a respective standard deviation Each of the N signal voltages is determined by way of integration of the signal current ($I_H$ or $I_L$, depending on what state a given cell is in) over capacitance, for a predetermined time, which generates a voltage at the end of the integration time associated with the cell being read.

The reference voltage $V_{REF}$ is determined in the same manner by taking the integrated current over integrated capacitance for each of the memory cells selected to be reference cells, and taking an average of the output values. As described above, the memory cells selected to be reference cells are selected from positions spread evenly around the array, being in a combination of erased and programmed states, and are three or more in number. In the extreme case, where there are only three, the average will be heavily shifted towards one side as the number of reference memory cells in one state will be double or half that of the number of cells in the other state (e.g. two written state cells and one erased state cell will shift the $V_{REF}$ center position significantly towards the mean of $V_{TH\_P}$). As will be described below, whilst this may not be useful in all cases, the greater possible shift of the reference voltage means it can still be used to shift the center position a very large amount without having to provide a separate biasing means. Conversely, at the other extreme, a very large number of memory cells in different states selected to be reference cells provides a higher granularity of control for making small, subtle shifts to the center position of $V_{REF}$.

If the input signal voltage is higher than the reference voltage, the comparator outputs that the cell is in its programmed state (i.e. a digital "1"). If the generated signal voltage is lower than the reference voltage, the comparator outputs that the cell is in its erased state (i.e. a digital "0"). It is assumed because of the mismatch variation of the signal current and capacitance (i.e. the signal currents and cell capacitances also have some variability so are also distributions with a respective mean and standard deviation) that the integrated signal voltages would, in practice, have mismatched distributions. In other words, the width of the $V_{TH\_E}$ and $V_{TH\_P}$ distributions is not necessarily the same in practice. However, it is assumed for this explanation that both distributions have the same standard deviation value σ.

The ratio of erased state cells to programmed state cells may be adjusted during manufacture with a write operation to change the width and position of the $V_{REF}$ distribution to match whatever variations are present in the $V_{TH\_E}$ and $V_{TH\_P}$ distributions so as to minimize any overlap, thus providing a greater degree of control during a memory array characterization step during manufacture.

As a backup option to act as a further degree of freedom to assist in the positioning of the center of $V_{REF}$, a suitable scaling (also known as a biasing) factor may be applied to $V_{REF}$. The purpose of the scaling factor can be to shift the center position of $V_{REF}$ so that it falls between $V_H$ and $V_L$. In practice this can be done by scaling the reference capacitance or current.

As described above, the reference block consists of multiple bitlines, described herein as reference bitlines but which are otherwise the same as the bitlines of the rest of the array. These are connected M times in parallel to the N comparators (see FIG. 7(b)). In particular, the outputs of the reference bitlines are all connected to each other and to the reference input of each of the comparators such that the reference bitlines are said to be connected in parallel to each respective reference input of the plurality of comparators. The effect of this is to narrow the standard deviation $\sigma_{REF}$ of the $V_{REF}$ distribution by a factor of $\sqrt{M}$ i.e. the $V_{REF}$ standard deviation is now $\sigma_{REF}/\sqrt{M}$. The greater the value of M, the narrower the $V_{REF}$ distribution will become. In FIG. 7(b), the reference bitlines are labelled as running from M−1 to 0.

As the width of the $V_{REF}$ distribution gets narrower, the time it takes to reach end of life is extended as memory cells can continue to be read successfully for longer as the narrower $V_{REF}$ distribution does not overlap with $V_H$ or $V_L$ until a longer time has passed and a greater degree of degradation has occurred.

Further, the more reference bitlines and thus memory cells that are in the reference block, the less effect parasitic capacitances and die-to-die variations (e.g. minor structural differences within manufacturing tolerances) will have on the operation of the memory because these are averaged out.

An additional advantage of the above described techniques is that calibration time of a memory may be significantly reduced as it is much easier and quicker to adjust the $V_{REF}$ distribution position and width than is possible using known techniques. This decreases total production time and cost without sacrificing performance of the memory with regard to process, voltage and temperature ranges, data retention and susceptibility to disturbance effects.

The system and method are of particular applicability to cases where the $V_{TH\_E}$ and $V_{TH\_P}$ distributions of the memory cells are very wide such that the separation between $V_{TH\_E}$ and $V_{TH\_P}$ is very small and $MW_{EFF}$ is very narrow.

As described above, the ability to shift the center position of the $V_{REF}$ distribution by changing the ratio of erased to programmed cells in the plurality of cells used to generate the $V_{REF}$ distribution has been discussed in connection with overcoming the effects of unequal distributions of erased and programmed cells in an array. However, the same technique can also be used to compensate for any other technological effects such as variations in process, voltage and temperature ranges which result from manufacturing techniques or operation of the array and which results in a change in position and/or width of the $V_{TH\_E}$ and $V_{TH\_P}$ distributions. In particular, the above described techniques provide the ability to always position the center of the $V_{REF}$ distribution exactly in the middle of the $V_{TH\_E}$ and $V_{TH\_P}$ distributions by providing an adjustable center position of the $V_{REF}$ distribution.

Further, as described above, the memory cells used to generate $V_{REF}$ are selected to be distributed evenly across the memory array. One reason for this is that cell position is a factor which contributes to cell response under different operating conditions (i.e. varying process, temperature and voltage ranges). Cells which are positioned close to each other on a die are more likely to have a similar operational response compared to cells which are positioned far away on a die. One reason for this is that minor manufacturing defects are likely to be local to certain positions and will thus affect local cells equally. By using a plurality of cells selected evenly from across different positions in the array (and thus across the die), the response variation of memory cells in proximity to the selected reference cells are inherently taken into account when determining an average $V_{REF}$. The term spread evenly means that the selected cells are positioned at approximately equal distances from each other in the array.

If parts of a die are known to have a specific effect on cell response, it is also possible to select a plurality of cells which are less evenly distributed across an array (e.g. to avoid an area). For example, reference memory cells may be selected to provide a $V_{REF}$ which is more strongly correlated with particular sections of the array. This provides another degree of freedom when positioning the center of the $V_{REF}$ distribution.

Each feature disclosed or illustrated in the present specification may be incorporated in the invention, whether alone or in any appropriate combination with any other feature disclosed or illustrated herein.

What is claimed is:

1. A flash memory comprising:
   a first plurality of memory cells, each memory cell of the first plurality of memory cells selectively connected to a first input of a comparator;
   a second plurality of memory cells selectively connected to a second input of the comparator;
   wherein a first number of the second plurality of memory cells are in an erased state;
   wherein a second number of the second plurality of memory cells are in a written state;
   wherein each memory cell of the first plurality of memory cells and each memory cell of the second plurality of memory cells has a first cell capacitance; and
   wherein a sum of the first number and the second number is at least three.

2. A flash memory according to claim 1, wherein each memory cell of the first plurality of memory cells and each memory cell of the second plurality of memory cells has a first size comprising a first channel length and a first channel width.

3. A flash memory according to claim 1, wherein the first plurality of memory cells and the second plurality of memory cells are distributed in an array, and wherein the second plurality of memory cells are in positions spread out evenly across the array.

4. A flash memory according to claim 1, wherein the second plurality of memory cells is configured to generate a reference voltage.

5. A flash memory according to claim 4, wherein the comparator is configured to compare a first voltage received at the first input with the reference voltage received at the second input.

6. A flash memory according to claim 4, wherein the second plurality of memory cells is configured to generate the reference voltage by integrating a signal current received from each memory cell of the second plurality of memory cells for a predetermined time.

7. A flash memory according to claim 1, comprising a plurality of comparators,
wherein the first plurality of memory cells is divided into a first plurality of bitlines, each connected to a respective first input of a respective comparator of the plurality of comparators; and
wherein the second plurality of memory cells is divided into a second plurality of bitlines connected in parallel to each respective second input of the plurality of comparators.

8. A method of operating a flash memory, said method comprising:
receiving at a first input of a comparator a first signal from a first memory cell of a first plurality of memory cells;
receiving at a second input of the comparator a second signal from a second plurality of memory cells,
wherein a first number of the second plurality of memory cells are in an erased state;
wherein a second number of the second plurality of memory cells are in a written state;
wherein each memory cell of the first plurality of memory cells and each memory cell of the second plurality of memory cells has a first cell capacitance; and
wherein a sum of the first number and the second number is at least three.

9. A method according to claim 8, wherein each memory cell of the first plurality of memory cells and each memory cell of the second plurality of memory cells has a first size comprising a first channel length and a first channel width.

10. A method according to claim 8, wherein the first plurality of memory cells and the second plurality of memory cells are distributed in an array, and wherein the second plurality of memory cells are in positions spread out evenly across the array.

11. A method according to claim 8, comprising generating the second signal with the second plurality of memory cells, wherein the second signal is a reference voltage.

12. A method according to claim 11, wherein said generating comprises integrating a signal current received from each memory cell of the second plurality of memory cells for a predetermined time.

13. A method according to claim 8, comprising, at the comparator, comparing the first signal and the second signal.

* * * * *